United States Patent
Suppa et al.

[11] Patent Number: 6,035,524
[45] Date of Patent: Mar. 14, 2000

[54] METHOD FOR FABRICATING AN ELECTRONICS BOARD WITH THERMAL-CONDUCTION COOLING

[75] Inventors: Vito Suppa, Roquefort les Pins; Noël Begnis, Cognes sur Mer; Jean-Claude Aldon, Nice, all of France

[73] Assignee: Thomson-CSF, Paris, France

[21] Appl. No.: 08/894,233

[22] PCT Filed: Jan. 30, 1996

[86] PCT No.: PCT/FR96/00150

§ 371 Date: Aug. 21, 1997

§ 102(e) Date: Aug. 21, 1997

[87] PCT Pub. No.: WO96/26631

PCT Pub. Date: Aug. 29, 1996

[30] Foreign Application Priority Data

Feb. 21, 1995 [FR] France .................... 95 01972

[51] Int. Cl.[7] .................................. H05K 3/30
[52] U.S. Cl. ................. 29/832; 29/832; 29/739; 29/833; 174/16.3; 361/709
[58] Field of Search ............ 29/832, 833, 840, 29/739, 741; 174/16.3, 16.4; 361/709, 713

[56] References Cited

U.S. PATENT DOCUMENTS

| | | | |
|---|---|---|---|
| 4,233,645 | 11/1980 | Balderes et al. | 361/385 |
| 4,768,286 | 9/1988 | Ketcham | 29/841 |
| 4,823,869 | 4/1989 | Arnold et al. | 165/185 |
| 5,172,301 | 12/1992 | Shneider | 361/383 |
| 5,198,651 | 3/1993 | Barkan et al. | 235/472 |
| 5,276,584 | 1/1994 | Collins et al. | 361/718 |
| 5,525,835 | 6/1996 | Nishiguchi | 257/712 |
| 5,552,992 | 9/1996 | Hunter | 364/474.05 |
| 5,650,912 | 7/1997 | Katsui et al. | 361/697 |
| 5,844,249 | 12/1998 | Takano et al. | 250/559.34 |

FOREIGN PATENT DOCUMENTS

| | | |
|---|---|---|
| 0313801 | 5/1989 | European Pat. Off. . |
| 2650146 | 7/1989 | France . |
| 2654890 | 5/1991 | France . |
| 2691604 | 11/1993 | France . |

Primary Examiner—Lee Young
Assistant Examiner—Minh Trinh
Attorney, Agent, or Firm—Oblon, Spivak, McClelland, Maier & Neustadt, P.C.

[57] ABSTRACT

Method for fabricating thermally cooled electronic cards. A card of any kind is covered with a rigid heat sink shaped to fit the card and is attached thereto. The heat sink is formed in such a way that it fits as closely as possible the shape of the printed circuit. The printed circuit has components on one or both faces so that it is possible to increase the surface thermal coupling between the sink and the board. An optical sensor using a laser beam may be used.

20 Claims, 3 Drawing Sheets

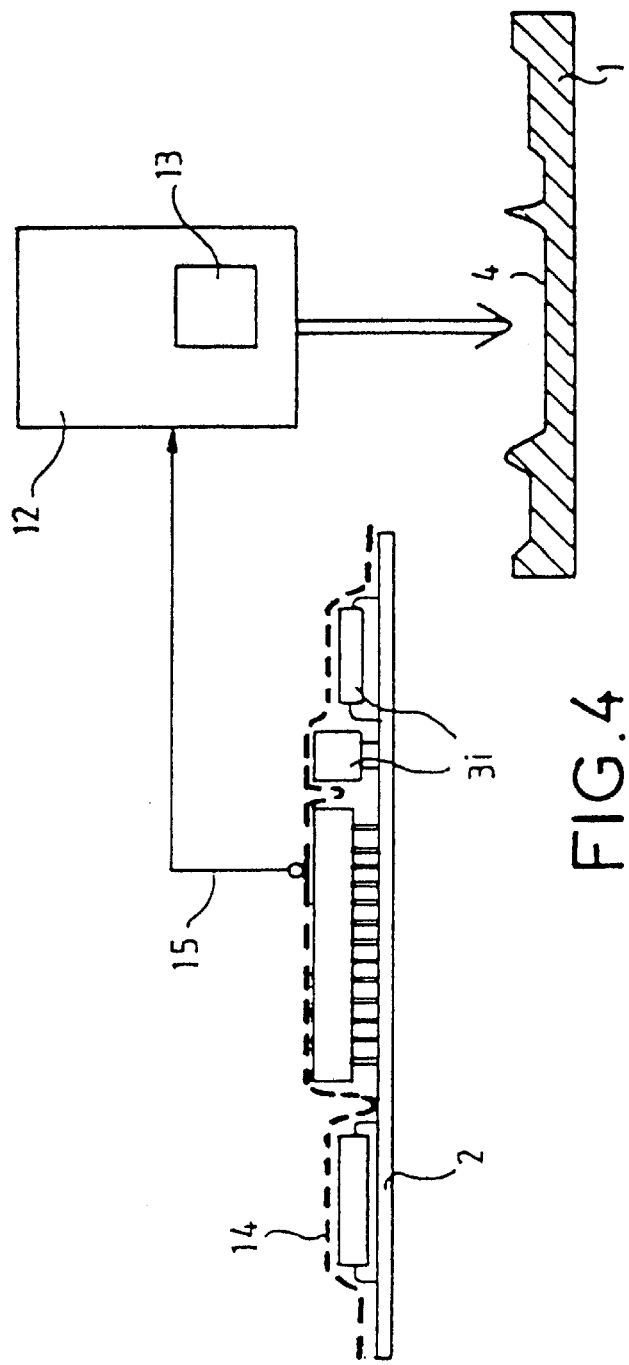
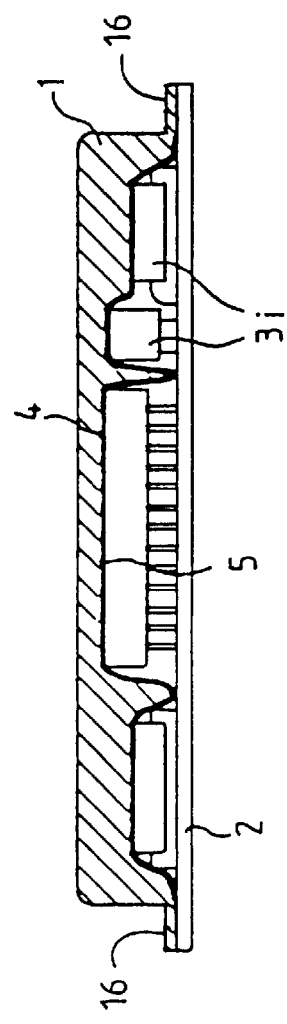
FIG. 4
FIG. 5

METHOD FOR FABRICATING AN ELECTRONICS BOARD WITH THERMAL-CONDUCTION COOLING

BACKGROUND OF THE INVENTION

1. Field of the Invention

The present invention relates to the field of dissipating the heat from electronic components on printed circuits, and its subject-matter is more particularly a method for fabricating an electronics board with thermal-conduction cooling.

2. Discussion of the Background

In the electronics components sector, integrated circuits are nowadays becoming smaller and smaller, while fulfilling increasingly complex functions. The rise in the integration density leads to an increase in the density of heat dissipated in the units containing the electronics boards, the physical dimensions of which are still of the same order of magnitude. Problems then arise with removing the energy dissipated as heat during their operation.

The effect of this is that, as the dimensions of the integrated circuits decrease, it becomes increasingly difficult and expensive to resolve the problems posed by thermal dissipation. Because of economic problems, the electronics industry, with essentially military applications, is diversifying into the civil industrial sector.

A great expansion of electronics hardware is currently being observed in the civil industrial sector, which in functional terms today rivals some military hardware.

In order to use boards designed initially for civil uses, it is then necessary to deal with environmental constraint and climatic constraint problems which are more severe in the military field than in the civil field.

Electronics components fabricators always specify a maximum operating temperature, above which the characteristics of the component are no longer guaranteed. Depending on the function of the component and its field of application, the maximum temperature varies from +70° C. for the industrial range to +125° C. for the military range. In order to use components which were initially provided for operation at a maximum temperature of 70° C., and are now intended to operate at a higher temperature, it is necessary to have local cooling of the electronics board equipped with the components.

Local cooling makes it possible to maintain an operating temperature which is compatible with the maximum allowable temperature for normal use of the board.

In order to promote the dissipation of heat from components wired on a printed circuit, it is known to use a conductive heat-transfer device placed between the components and the cover of the metal unit containing the board equipped with the components, the cover being used as a dissipative cooling plate.

In one known embodiment, a plastic sachet containing a coolant of the "fluoradiator" type is used; a sachet of this type is marketed under the brand name Fluorinert.

A thermal dissipation device of this type is difficult to use in devices which contain a plurality of boards, for example board racks fitted to bay structures. This is because the boards are generally positioned vertically inside the rack, and the small space between the boards does not allow a dissipative cold plate to be inserted. Furthermore, because of the vertical position of the boards, a device of the cooling-sachet type could no longer be held on the board. Finally, the sachet-type device is fairly stiff and can only fit on the top of those electrical components which protrude furthest from the printed circuit board. The interface between the components and the sachet is not optimized. It is thus not possible for some of the components, which are not in contact with the sachet, to be cooled sufficiently to allow them to operate in the temperature ranges specified for military applications. This means that boards equipped in this way are ruled out from these applications.

In order to resolve this problem and to allow the use of any commercial board for military uses, the applicant company has described, in French Patent Application No. 92 06041 filed on May 19, 1992 and published on Nov. 26, 1993 under U.S. Pat. No. 2,691,604, a method which consists in forming, on any board equipped with components, a rigid heat sink which is fixed to the board, matches the components as closely as possible and thus allows them to be cooled, even for the highest temperatures in the military range, it being possible for the board to be used in hardware which includes board racks.

To this end, this method uses a system for taking a scan of the face on which the electronic components are located, or of an impression of this face, which uses a mechanical sensor whose precision, robustness and scanning speed are mediocre.

SUMMARY OF THE INVENTION

In order to overcome these drawbacks, the invention provides a method for fabricating an electronics board with thermal-conduction cooling, this board having a printed circuit on which electronic components are fixed on at least one of the faces of the printed circuit, this circuit being associated with a device for removing heat, in which:

an impression of the face of the printed circuit equipped with the components is formed, the impression is scanned with a position sensor in order to describe its entire surface, the positional information delivered by the sensor is converted and processed using a computer system in order to form a machining programme, on the basis of the machining programme, a programmable machine tool is used to machine a rigid heat sink, one face of which is designed to match as closely as possible that face of the printed circuit which is equipped with the components, that face of the printed circuit which is equipped with the components is covered with the heat sink, and the heat sink is fixed mechanically on the printed circuit equipped with the components;

this method being mainly characterized in that the position sensor comprises a laser digitizing head making it possible to obtain the co-ordinates of the various points of the said face.

According to another characteristic, clearances are formed in the sink, making it possible to access certain parts of the said face and/or of the components which it supports.

According to another characteristic, the position sensor is made to follow directly that face of the printed circuit which is equipped with the components.

According to another characteristic, the sink is provided with a liquid circulation system making it possible to cool this sink.

According to another characteristic, this circulation system is of the cooling-coil type.

According to another characteristic, the sink is connected to the electrical earth of the board in order to screen this board electromagnetically.

According to another characteristic, the sink is extended as far as the edges of the board, and the edges of this sink are thinned in order to allow them to be inserted into the rails for holding the board, which makes it possible to use rails of the thermal type.

BRIEF DESCRIPTION OF THE DRAWINGS

Other particular features and advantages of the invention will emerge more clearly from the following description, presented by way of non-limited example and given with reference to the appended figures, in which:

FIG. 4 represents a second embodiment of the method according to the invention; and FIG. 5 represents an alternative embodiment of the invention.

DISCUSSION OF THE PREFERRED EMBODIMENTS

In the following description, the elements common to each of the figures are identified by the same reference.

Figure 1A:
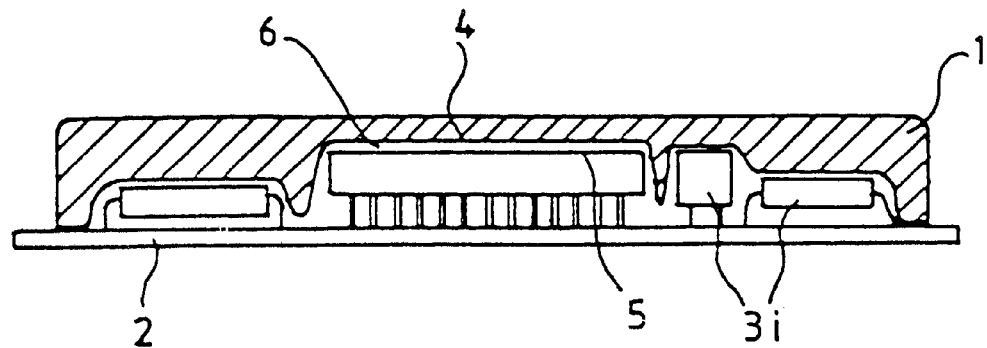
FIG. 1a represents a sectional view of a heat-sink assembly produced in accordance with the method according to the invention, with a printed circuit equipped with components.

FIG. 1a illustrates a sectional view of an electronics board with thermal cooling which is fabricated in accordance with the method according to the invention. This board has a heat-sink assembly 1 with a printed circuit 2 equipped with electronic components 3i. That face 4 of the heat sink 1 which faces the components 3i exactly follows that face 5 of the printed circuit 2 which is equipped with the components 3i, and fits perfectly on it. The two faces 4 and 5 are separated by an empty space 6 measuring a few tenths of a millimeter, corresponding, for example, to the thickness of a film described below.

Figure 1B:
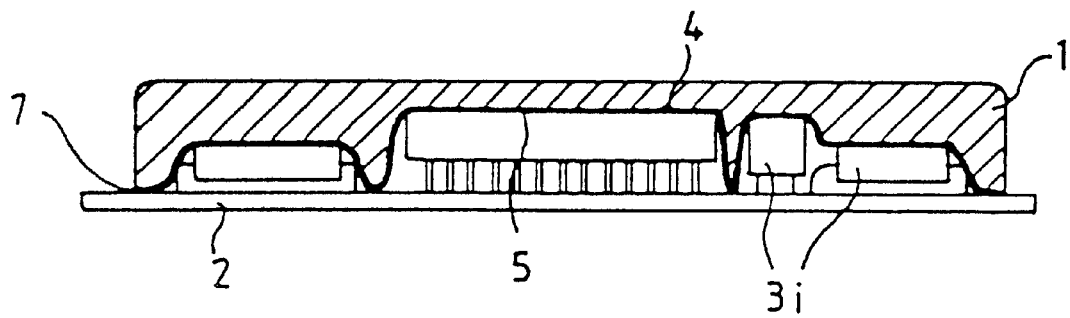
FIG. 1b represents the sectional view of the above assembly, supplemented with a material which provides the interface between the sink and the printed circuit equipped with components.

The space 6 is advantageously used, on the one hand, to ensure thermal coupling between the sink 1 and the printed circuit 2 and, on the other hand, to ensure mechanical coupling by fixing the sink 1 on the printed circuit 2 equipped with the components 3i. As shown by the sectional view in FIG. 1b, the mechanical and thermal coupling is produced by one or more materials 7 which, independently or in combination, fulfil the functions of an electrical insulator and a good conductor of heat, and may be adhesive. These materials may, for example, be a mastic, a resin, a varnish, a grease, or a gel, which are inserted between the face 4 of the sink 1 and the face 5 of the printed circuit 2 which is equipped with the components 3i. The materials 1 completely fill the space 6 and thus ensure surface thermal coupling without points for heat to accumulate.

Fixed in this way on the printed circuit 2, the heat sink 1 also seals the electronics board 2 and 3i, in particular against water vapour. The materials 7 used to provide the thermal and mechanical coupling can be dissolved using a solvent which is suitable for the materials 7, or can be destroyed mechanically in order to make it possible to remove the sink 1 if it becomes necessary to operate on the electronic components 3i installed on the printed circuit 2.

This heat sink 1 also makes the board more mechanically rigid. It may therefore also be considered as a mechanical stiffener.

Furthermore, the heat sink may be connected to a reference electrical potential, for example the earth of the board, in order to allow it to fulfil the role of an electromagnetic screen. This protection is particularly efficient in solving the problems of electromagnetic compatibility between neighbouring boards in the same rack.

Figure 1C:
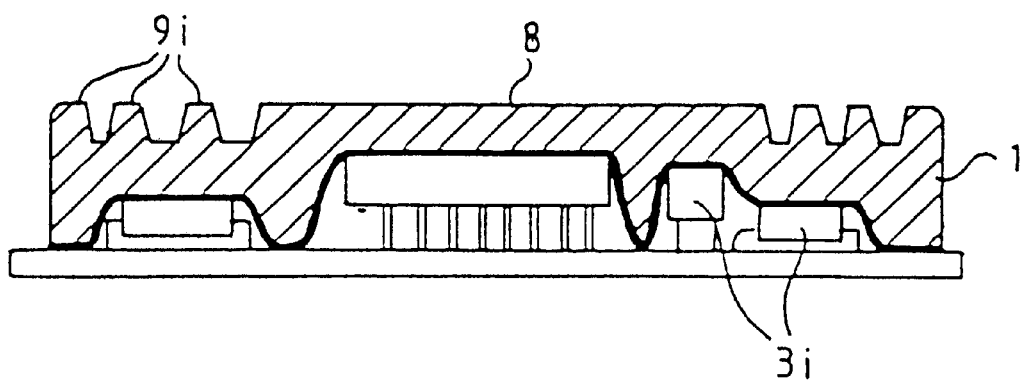
FIG. 1c represents the sectional view of the above assembly, with a sink produced according to a variant of the invention.

As shown by the sectional view in FIG. 1c, that face 8 of the heat sink 1 which is opposite the components 3i may advantageously be profiled. It is, for example, provided with notches 9i, of the radiator-fin type, thus making it possible to increase the convective heat exchange between the heat sink 1 and the surrounding air.

Figure 2:
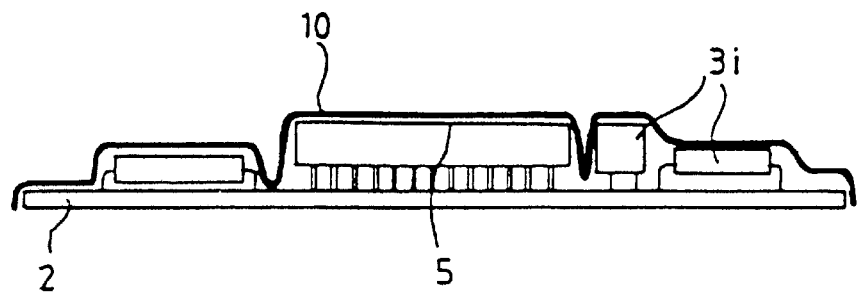
FIG. 2 represents the taking of an impression of an electronics board.

FIG. 2 illustrates a first step of a first embodiment of the method according to the invention, during which an impression is taken of the face 5 of the printed circuit 2 and of the components 3i fitted on the printed circuit 2.

An arbitrary type of commercially available board 2 and 3i, consisting of the printed circuit 2 and the components 3i fitted on the printed circuit 2, may be temporarily coated with a film 10 of small thickness, for example of the order of 0.5 mm. The film 10 is made of a thermoformable rigid material which is preferably also antistatic in order to prevent any electrostatic discharge that might destroy some of the fragile components in contact with the film 10.

In order to deform the film 10, an example of a known technique consists in softening the film 10 which is made of thermoplastic, for example a material such as Macrolon (registered trade mark), polycarbonate, PVC, etc., under the action of a heat source, and at the same time in sucking the film 10 in the direction of the components 3i by creating a pressure reduction or partial vacuum between the film 10 and the printed circuit 2.

The film 10 thus matches the shape of the components 3i as closely as possible and may at places touch the surface of the printed circuit 2 in the widest spaces between components 3i. Once it has cooled, the film 10 retains the deformation which it has undergone during the previous operation, in the form of an impression, actually corresponding to the moderated, or smoothed, relief of the actual relief which the components 3i, distributed over the surface of the printed circuit 2, have.

Figure 3:
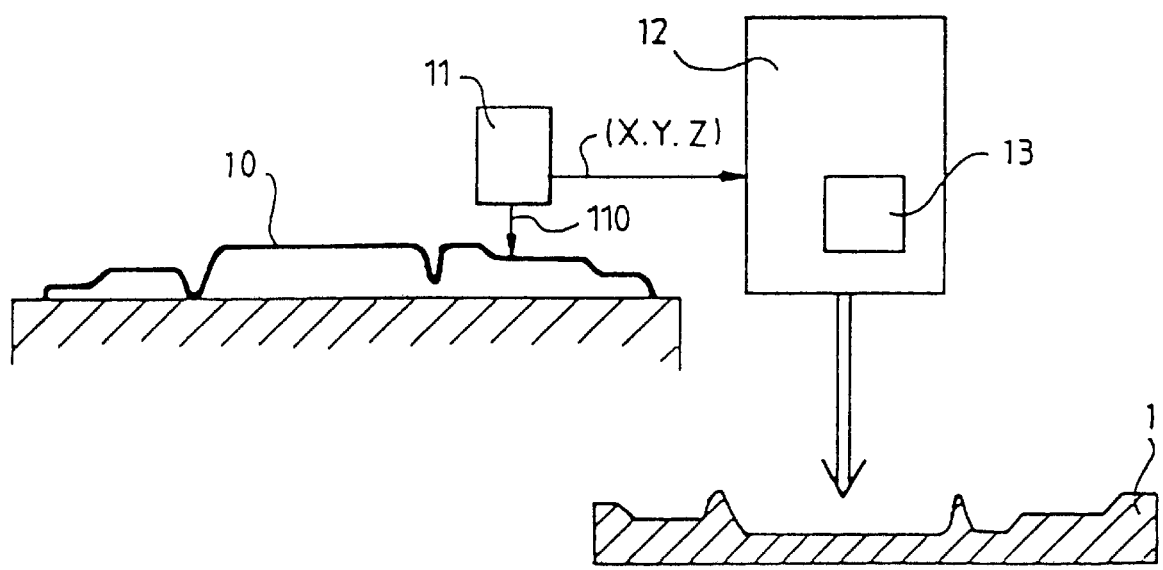
FIG. 3 represents a first embodiment of the method according to the invention.

Using the impression of the relief, if appropriate represented by the film 10 as described above, a second step in the first embodiment of the method according to the invention, this step being illustrated by FIG. 3, consists in using a position sensor (X.Y.Z) 11 in order to form the heat sink 1 tailored to the board 2 and 3i whose impression has been taken. According to the invention, the height dimension Z is obtained using an optical probe operating using a laser beam 110. This sensor sweeps the surface of the film 10, or of the board, and transmits the three-dimensional positional information (X-Y-Z) to a programmable machine tool 12, in the form of a machining programme 13. This sensor may, in particular, be formed by a digitizing head, such as the ones which are used in known fashion in integrated machining systems. The distance is measured, in known fashion, by triangulation. In order to facilitate the laser-beam scanning when the film 10 is not used, the board surface on which the components are located may be dusted with a white powder which allows appropriate back-scattering of the laser beam.

The heat sink 1 is machined in a rigid material which is a good conductor of heat, for example an aluminium alloy, and thus constitutes the "negative" of the face 5 of the printed circuit 2 equipped with the components 3i.

In a particular alternative embodiment, clearances, that is to say holes, are formed in the sink, these making it possible to access certain parts of the said face (5) and/or the components which it supports.

In particular applications, for example missiles or torpedoes, a thermal equilibrium point between the heat sink and the surrounding environment is not reached during the very short time for which the board is used (transient use). The heat sink which is used is then used as a heat reservoir.

Aluminium is a material which has a very high capacity for storing heat. Furthermore, a heat sink made of a material based on aluminium may be arranged in such a way that it can accommodate materials exhibiting a solid/solid phase change, for example acetamide, or a liquid/vapour phase change, or example methanol. These materials, in the form of inserts, are placed within the thickness of the heat sink and thus make it possible to increase the heat capacity of the heat sink.

A liquid circulation system, for example a cooling coil, which makes it possible to effect cooling by circulating a liquid delivered by an external source, may also be included in the sink thus produced.

It is also advantageously possible to machine the edges 16 of the sink, in order to thin them, for example to a thickness of 5 tenths of a millimeter, so that they can be extended until they are level with the edges of the substrate 2 of the board.

This makes it possible for the edges of the sink to slide, like the edges of the board, in the rails for holding them in the rack intended to receive the board. Models referred to as "thermal" can then be used for these rails. These thermal rails, which are known per se, make it possible to cool the sides of the board, and therefore the sink, by transferring heat from the sink to a heat dump external to the board. This heat dump may, for example, be a cold plate forming part of the rack which receives the boards and contains these rails. This system, which may also operate in the board connector, is, in particular, described in French Patent Application No. 89 09638 filed by the applicant company on Jul. 18, 1989 and published on Jan. 25, 1991 under U.S. Pat. No. 2,650, 146.

A second embodiment of a heat sink according to the invention, illustrated by FIG. 4, consists in directly recording the profile 14, represented by a dashed line, of the face 5 which the printed circuit 2 and the components 3i have, in order to describe the entire surface of the face 5 without employing the intermediary of the film 10.

The position sensor 15 is designed to track the contour of the profile 14. Since the processing of the positional information (X-Y-Z) is then exactly the same as in the first embodiment, it will not be described again. In order to preserve the space 6 which, in the preceding embodiments, corresponds to the thickness of the film 10 and allows mechanical and thermal coupling between the sink 1 and the printed circuit 2 equipped with the components 3i, it is sufficient to provide in the machining programme 13 an offset, for example of 0.5 mm, between the real profile 14 recorded by the sensor 15 and the profile to be machined, corresponding to the face 4 of the sink 1, and a smoothing subroutine which makes it possible to obtain reliefs which are neither too narrow nor too accentuated.

The last step in the method according to the invention then consists in covering the printed circuit, and the components 3i fitted on the circuit 2, with the heat sink 1 produced according to one of the preceding embodiments, and in mechanically fixing the sink 1 on the board 2 and 3i by means of the material 7 filling the space 6 between the sink 1 and the board 2 and 3i, in order to provide mechanical and thermal coupling between the sink 1 and the board 2 and 3i.

The invention is not limited to the specific description of the preceding embodiments:

in particular, any materials which constitute the sink, the film as well as the interface between the sink and the electronics board equipped with the components, and exhibit the characteristics which are useful to the invention, fall within the scope of the present invention.

Similarly, the invention is not limited to a circuit which is printed on just one face, and may also be extended to a circuit which is printed on both faces, the board then having one heat sink on each side of the printed circuit.

What is claimed is:

1. A method for fabricating an electronics board with thermal-conduction cooling, the board having at least one surface having a printed circuit including associated electronic components fixed to the printed circuit, the method comprising:

scanning the at least one surface including the printed circuit with the fixed electronic components with a sensor to obtain profile information and related coordinates of various points on the at least one surface having the printed circuit including associated electronic components;

delivering the profile information and related coordinates to a computer system;

processing the profile information and related coordinates using an image program with a subroutine for smoothing the profile information and related coordinates so as to obtain smooth reliefs as a part of a machining program;

controlling a programmable machine tool using the machining program to machine a rigid heat sink so that a machined face of the rigid heat sink closely matches the profile of the at least one surface having the printed circuit with the fixed electronic components; and covering and mechanically fixing the machined rigid heat sink to the at least one surface having the printed circuit with the fixed electronic components.

2. The method according to claim 1, wherein the controlling of the programmable machine tool is done in a manner permitting the formation of clearances in the machined face of the rigid heat sink permitting access to parts of the printed circuit including any associated electronic components.

3. The method according to claim 1, further comprising dusting the at least one surface including the printed circuit and associated electronic components with white powder in order to improve the obtaining of the profile information and related coordinates.

4. The method according to claim 2, further comprising dusting the at least one surface including the printed circuit and associated electronic components with white powder in order to improve the obtaining of the profile information and related coordinates.

5. The method according to claim 1, further comprising providing the rigid heat sink with a liquid circulation system to further cool the rigid heat sink.

6. The method according to claim 2, further comprising providing the rigid heat sink with a liquid circulation system to further cool the rigid heat sink.

7. The method according to claim 4, further comprising providing the rigid heat sink with a liquid circulation system to further to cool the rigid head sink.

8. The method according to claim 5, wherein the providing step includes providing the liquid circulation system to include a cooling-coil.

9. The method according to claim 6, wherein the providing step includes providing the liquid circulation system to include a cooling-coil.

10. The method according to claim 7, wherein the providing step includes providing the liquid circulation system to include a cooling-coil.

11. The method according to claim 1, further comprising connecting the rigid heat sink to an electrical earth provided on the board in order to screen the board electromagnetically.

12. The method according to claim 2, further comprising connecting the rigid heat sink to an electrical earth provided on the board in order to screen the board electromagnetically.

13. The method according to claim 4, further comprising connecting the rigid heat sink to an electrical earth provided on the board in order to screen the board electromagnetically.

14. The method according to claim 7, further comprising connecting the rigid heat sink to an electrical earth provided on the board in order to screen the board electromagnetically.

15. The method according to claim 10, further comprising connecting the rigid beat sink to an electrical earth provided on the board in order to screen the board electromagnetically.

16. The method according to claim 1, further comprising extending the rigid heat sink as far as the edges of the board and thinning the edges of the rigid heat sink in order to allow the thinned edges to be inserted into thermal rails for holding the board.

17. The method according to claim 2, further comprising extending the rigid heat sink as far as the edges of the board and thinning the edges of the rigid heat sink in order to allow the thinned edges to be inserted into thermal rails for holding the board.

18. The method according to claim 4, further comprising extending the rigid heat sink as far as the edges of the board and thinning the edges of the machined rigid heat sink in order to allow the thinned edges to be inserted into thermal rails for holding the board.

19. The method according to claim 7, further comprising extending the rigid heat sink as far as the edges of the board and thinning the edges of the rigid heat sink in order to allow the thinned edges to be inserted into thermal rails for holding the board.

20. The method according to claim 10, further comprising extending the rigid heat sink as far as the edges of the board and thinning the edges of the rigid heat sink in order to allow the thinned edges to be inserted into thermal rails for holding the board.

* * * * *